United States Patent
Hallberg

(10) Patent No.: US 6,640,327 B1
(45) Date of Patent: Oct. 28, 2003

(54) FAST BCH ERROR DETECTION AND CORRECTION USING GENERATOR POLYNOMIAL PERMUTATION

(75) Inventor: Bryan Severt Hallberg, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 517 days.

(21) Appl. No.: 09/704,390

(22) Filed: Nov. 1, 2000

(51) Int. Cl.[7] .............................................. H03M 13/00
(52) U.S. Cl. ...................... 714/785; 714/762; 714/759; 714/758
(58) Field of Search ................. 714/785, 781, 714/758, 762, 746, 759

(56) References Cited

U.S. PATENT DOCUMENTS 6,487,691 B1 * 11/2002 Katayama et al. .......... 714/784

* cited by examiner

Primary Examiner—Phung M. Chung
(74) Attorney, Agent, or Firm—Marger Johnson & McCollom

(57) ABSTRACT

Methods and apparatus for cyclic code codeword creation, error detection, and error correction are disclosed. The methods and apparatus utilize a set of permuted generator polynomials, each representing shifted and exclusive-ored (XORed) versions of the cyclic code generator polynomial according to a specific input bit pattern. The permuted generator polynomial may be provided by look-up table, hardware, or a software equivalent of this hardware.

Use of the permuted generator polynomial greatly reduces the number of calculations required to calculate syndromes and trap errors in codewords. The permuted generator polynomial can be used to replace m iterations of a polynomial division operation with a single XOR operation. The bit pattern used to select a permuted generator polynomial is derived from the m high-order bits of the dividend at each step.

Using the disclosed embodiments, the number of clock cycles or instruction cycles required to perform cyclic code computations can be significantly reduced for both hardware and software implementations.

31 Claims, 7 Drawing Sheets

FAST BCH ERROR DETECTION AND CORRECTION USING GENERATOR POLYNOMIAL PERMUTATION

FIELD OF THE INVENTION

This present invention relates to digital data error detection and correction, and more particularly to a method and apparatus for performing error detection and correction using cyclic codes.

BACKGROUND OF THE INVENTION

Cyclic codes are commonly used for digital signal error detection and error correction. Digital communication systems often employ cyclic code error correction to increase the reliability of information transmission. Digital magnetic and optical storage systems use cyclic code error correction to provide reliable storage and retrieval of data.

To create a cyclic codeword, a cyclic redundancy check (CRC) is calculated for a group of information bits. The CRC is then appended to the information bits to form a codeword, which is transmitted (or stored). A system receiving the codeword can use the CRC to detect (and correct a limited set of) errors that may have been introduced into the codeword during transmission (or storage and retrieval). The CRC thus allows corrupted codewords to be detected, and the original information bits to be recovered from a corrupted codeword in many common error situations.

Within the class of cyclic codes, BCH codes (named for Bose, Chaudhuri, and Hocquenghem, who discovered the basic properties of BCH codes) are used extensively. BCH codes are identified by their total length, n, and their information length, k, using the conventional notation BCH (n,k). For example, a BCH(15,7) code has an overall length of fifteen bits, seven of which are information bits. The remaining eight bits are CRC bits.

BCH error correction requires the calculation of one or more syndromes, both at the transmitter and at the receiver. Syndrome calculation is performed by dividing the codeword by a generator polynomial using modulo two arithmetic. The division requires one codeword shift and one codeword exclusive-or (XOR) operation for each information bit present. When the error correction technique further employs Fire code error trapping for burst error correction, additional shift and XOR operations may be required, depending upon the error location and pattern. The maximum number of additional shift and XOR operations required can be as large as the total number of bits in the codeword, minus one. The following example illustrates the steps performed in BCH burst error correction using the BCH(15,7) code.

The generator polynomial for the BCH(15,7) code is $x^8+x^7+x^6+x^4+1$, or 111010001. The variable x is used as a place holder. The transmit codeword CRC is calculated by first multiplying the information bits by x raised to the CRC length (in this case $x^8$), which effectively appends a series of zeros equal in length to the CRC length, and second dividing this result by the generating polynomial. Assuming the information bits are, for example, 1001101, then the transmit codeword CRC is calculated as follows.

Multiplication by $x^8$:

$$1001101 = x^6 + x^3 + x^2 + 1$$
$$(x^6 + x^3 + x^2 + 1)*x^8 = x^{14} + x^{11} + x^{10} + x^8$$
$$x^{14} + x^{11} + x^{10} + x^8 = 100110100000000$$

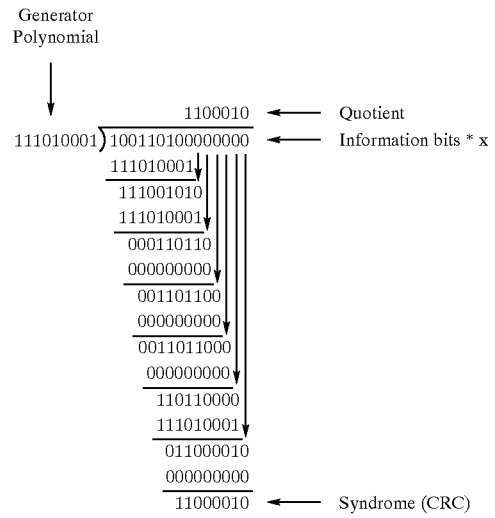

Division by generator polynomial:

The transmit codeword is calculated by multiplying the information bits by x raised to the CRC length and adding the CRC. In this example, the transmit codeword is:

| | |
|---|---|
| 100110100000000 | Information bits * $x^8$ |
| 000000011000010 | CRC |
| 100110111000010 | Transmit codeword |

The BCH(15,7) code can correct any burst error up 4 bits long. Assuming the transmit codeword is subjected to the burst error pattern 000110100000000, then the receive codeword will be:

| | |
|---|---|
| 100110111000010 | Transmit codeword |
| 000110100000000 | Error pattern |
| 100000011000010 | Receive codeword |

The receiver corrects the receive codeword by first calculating the receive codeword's syndrome, and then, in case of burst error trapping, calculating additional syndromes until the error is trapped or all possible error locations have been tested. The receive codeword's syndrome is calculated by dividing it by the generator polynomial, as shown below for the BCH(15,7) example.

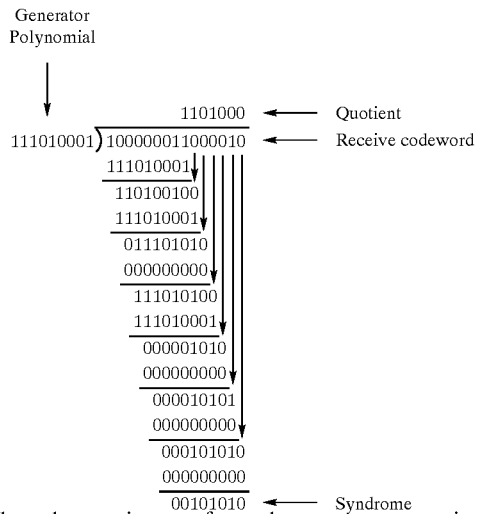

When the receiver performs burst error correction, the syndrome is iteratively multiplied by x and divided by the generator polynomial until the error is trapped in the syndrome. The error is trapped when the most significant bits (msb's) of the syndrome are all zero. The least significant bits (lsb's) then contain the error pattern, and the position of the error is given by the number of iterative divisions required to trap the error. The least significant bit field length is equal to the maximum burst error length which the code can correct. The most significant bits are the remaining bits. The total number of iterative divisions which may be required is equal to the codeword length minus one, then the iterative syndromes recycle starting with the initial syndrome.

For the BCH(15,7) example, the number of msb's is four, the number of lsb's is four, and the total number of iterative divisions required is fourteen. The following shows how the BCH(15,7) error would be trapped.

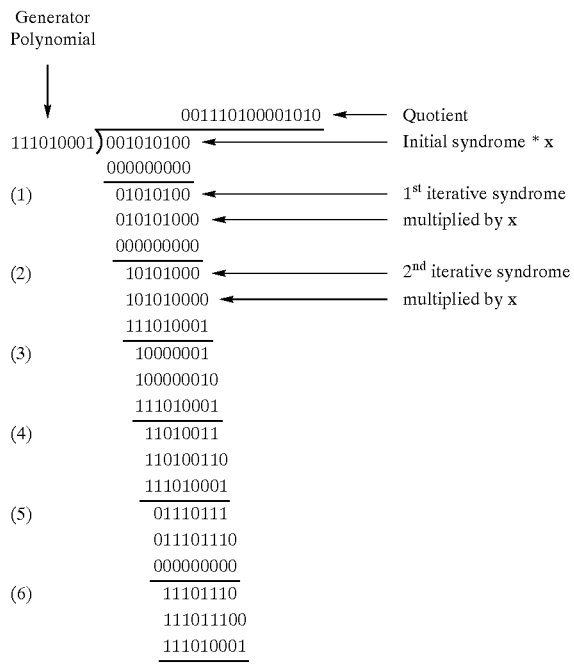

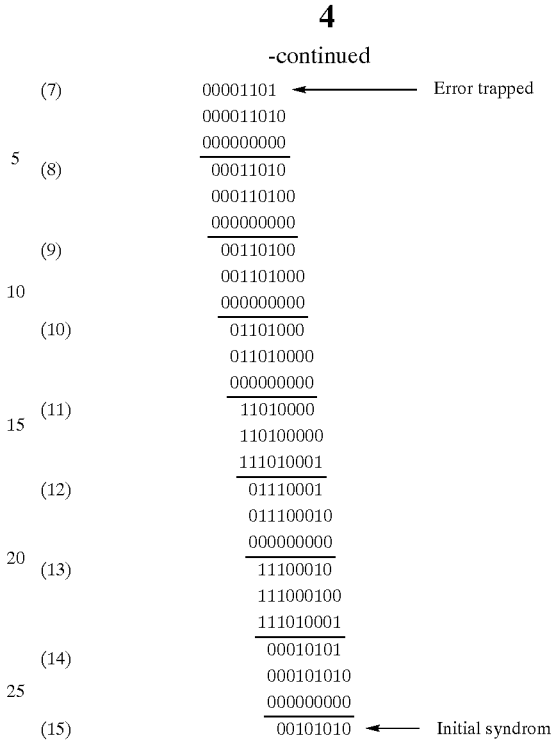

The error location is equal to the codeword length minus the iteration number modded with the codeword length.

error_location=(codeword_length−iteration_number) mod codeword_length

For the BCH(15,7) example above, this is equal to bit 8.

8=(15−7)mod 15

The receive codeword is corrected by multiplying the error pattern by x raised to the error location and adding it to the receive codeword.

| 100000011000010 | Receive codeword |
| 000110100000000 | Error pattern * $x^{error\_location}$ |
| 100110111000010 | Corrected codeword |

The corrected information is then extracted from the corrected codeword.

These bit-aligned operations are inefficient for both hardware and software implementations. Hardware requires one clock cycle per shift/XOR operation. For the case of burst correction BCH(15,7), this is a total of 21 clock cycles. In many systems, the system clock is the same frequency as the bit rate, and thus only fifteen clock cycles would be available to perform the error correction for the BCH(15,7) case. Software requires one iteration loop pass per shift/XOR operation, and thus would require 21 iterations for the BCH(15,7) case. Also, software algorithms are faster if they are byte aligned rather than bit aligned. Byte alignment removes the need for shifting altogether. Thus, for both hardware and software, a faster, non-bit aligned algorithm is desirable.

In U.S. Pat. No. 3,859,630, issued Jan. 7, 1975, to Bennett, a parallel cyclic code error correction apparatus is disclosed. The apparatus of the '630 patent accomplishes parallel cyclic encoding and decoding using read-only memory (ROM) banks instead of serial shift/XOR operations. The encoder and decoder each have a ROM bank that stores a CRC value for each possible information bit sequence. In addition, the decoder has a second ROM bank that stores an error bit pattern for each possible "error pattern" that can be formed by comparing a received CRC with a CRC based on the received information bits. The main drawback of this fully-parallel system is that the size of the ROM banks is impracticable for even moderately-sized cyclic coding schemes. For instance, a BCH(127,120) code would require approximately $1.33 \times 10^{36}$ ROM CRC entries in a '630 patent implementation.

SUMMARY OF THE INVENTION

The embodiments disclosed herein provide for fast cyclic code syndrome calculation and fast burst error trapping. These embodiments utilize a set of permuted generator polynomials, each representing shifted and exclusive-ored (XORed) versions of the cyclic code generator polynomial according to a specific input bit pattern. The permuted generator polynomial may be provided by look-up table, hardware, or a software equivalent of this hardware.

In one aspect of the invention, a method for calculating a syndrome is disclosed. Considering a generator polynomial G of length g+1, capable of correcting a t-bit burst error, and an associated n-bit cyclic error correction codeword C, containing a k-bit information field, such that g=n−k, the method comprises the following. A shift distance m, greater than one but less than or equal to k, is pre-selected, and an iteration counter j is initialized to zero. A length-m address $A_j$ is formed by stripping the m most significant bits (msb's) from C. The address $A_j$ is used to retrieve a corresponding first permuted generator polynomial. This permuted generator polynomial is then XORed with the g most significant remaining bits of C, forming a result R. Result R will, in many implementations, be fed back into the system as a new $C_j$ of length n−(j*m), where j has been incremented by one to the current iteration index. If at any iteration, the new $C_j$ contains less than m+g bits, then the new $C_j$ is prepended with zeros to obtain the required minimum m+g length before being fed back into the system. This process is repeated until a desired result is achieved (e.g., a syndrome is calculated at R).

Codeword C can be, for example, information bits multiplied by $x^g$ or a received codeword. Codeword $C_j$ can be, for example, an intermediate dividend of a syndrome calculation.

In a second aspect of the invention, a cyclic code error detection apparatus is disclosed. The apparatus comprises a permuted generator polynomial unit that accepts an input address and outputs, for a defined generator polynomial, a g-bit permuted generator polynomial corresponding to the input address and a shift distance m, whose value is greater than one but less than or equal to g−t+1. The apparatus further comprises a syndrome calculator to calculate a g-bit syndrome for a codeword using a permuted generator polynomial obtained from the permuted generator polynomial unit, for an input address comprising the m most significant bits from the codeword. The apparatus may further comprise additional elements allowing it to build codewords, detect errors in codewords, and/or trap and correct errors in codewords.

BRIEF DESCRIPTION OF THE DRAWING

The invention may be best understood by reading the disclosure with reference to the drawing, wherein.

DETAILED DESCRIPTION OF THE PREFERRED EMBODIMENTS

The following description discloses methods and devices, according to several embodiments of the invention, for handling burst error correction with the BCH(15,7) code described in the background material. The development of embodiments with the BCH(15,7) code is exemplary, as one of ordinary skill can, after reading this disclosure, apply the invention to other cyclic codes, code lengths, syndrome lengths, and generator polynomials.

As used herein, cyclic code error detection apparatus includes encoders that create cyclic-coded codewords, decoders that detect errors in cyclic-coded codewords, and decoders that correct errors in cyclic-coded codewords. Such apparatus may be implemented in special-purpose hardware, as a programmed microprocessor with attached or embedded memory, or as a combination of these elements, and is generally a component of a larger system.

Figure 1:
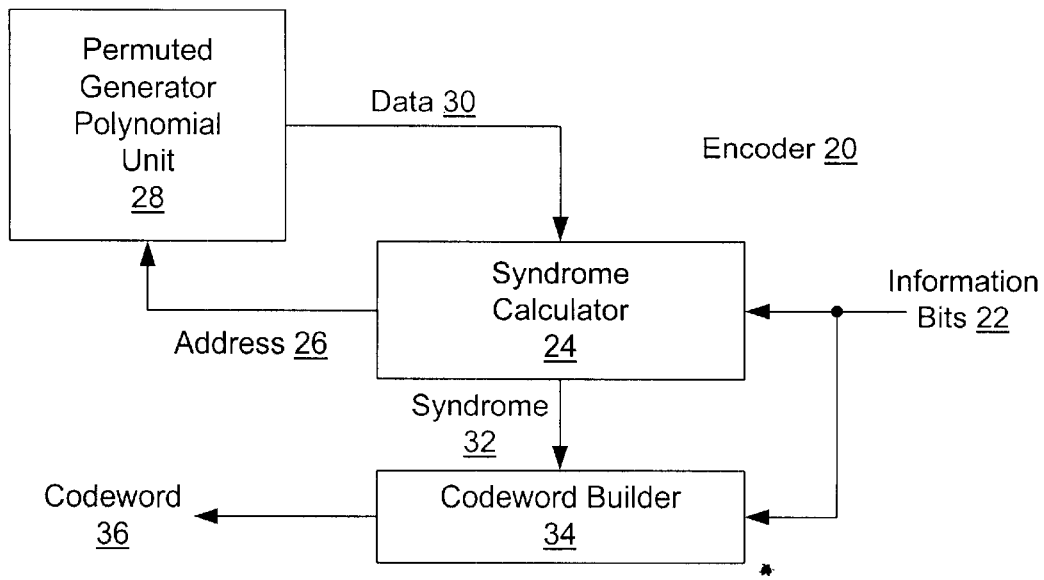
FIG. 1 shows a block diagram for a cyclic code encoder according to one embodiment of the invention.
Figure 2:
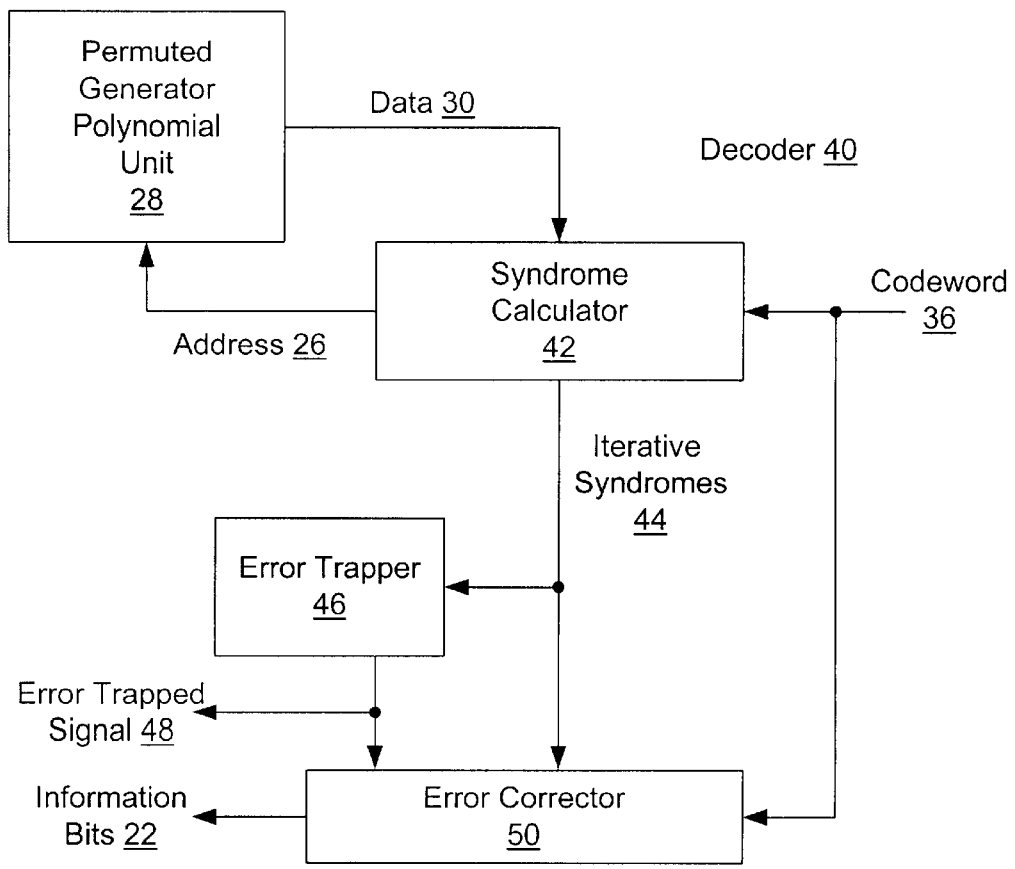
FIG. 2 shows a block diagram for a cyclic code decoder according to one embodiment of the invention.

As an introduction, FIGS. 1 and 2 show high-level block diagrams for an encoder 20 and a decoder 40 according to cyclic code error detection apparatus embodiments of the invention. Considering encoder 20 first, encoder 20 accepts information bits 22 and generates a codeword 36. Codeword 36, as output by codeword builder 34, typically contains information bits 22 and syndrome 32 in separate bit fields, although this is not required (in some implementations the information bits can be derived from the codeword but, are not explicitly visible in the codeword). As will be detailed below, syndrome calculator 24 calculates syndrome 32 in a predetermined number of steps. At each step, syndrome calculator 24 supplies an address 26 to permuted generator polynomial unit 28, and receives data 30 back from unit 28. Data 30 is described herein as a permuted generator polynomial, for reasons that will become apparent shortly. The permuted generator polynomial is combined with selected information bits 22 to produce an intermediate result, part of which is used to derive a new address 26 for the next step in the syndrome calculation.

Operation of decoder 40 is similar to operation of encoder 20, although decoder 40 has additional functionality. Syndrome calculator 42 has an operational mode that allows it to calculate, based on the first-calculated syndrome, iterative syndromes 44 (the initial syndrome can also be considered an iterative syndrome). The iterative syndromes are examined by error trapper 46, which detects the presence of correctable errors in the codeword and produces an error trapped signal 48 when an error is trapped in an iterative syndrome. Error corrector 50 responds to error trapped signal 48 to correct codeword 36 using the iterate syndrome 44 that resulted in the error trapped signal 48.

The present invention can be implemented in both software and hardware embodiments. These embodiments have several distinct advantages over prior-art techniques. Software embodiments can be designed to avoid bit-aligned operations that require physical bit-shifting. The number of iterations required to calculate a syndrome and trap errors can be reduced by roughly a factor of m, where m is the "shift width" (which is also the address width of address 26 supplied to permuted generator polynomial unit 28). Where unit 28 is implemented with a look-up table, $2^m$ entries are required, allowing look-up table size to be traded for iteration count in many embodiments. In hardware implementations supporting a fixed generator polynomial, unit 28 can be built using n×WXOR gates, where W is bounded by the number of 1's in the generator polynomial and depends on the bit pattern of the fixed generator polynomial. In other hardware implementations, the hardware can be designed to support multiple shift widths and generator polynomial lengths.

A software embodiment will be described first, as an understanding of the preferred software methods will aid understanding of the hardware embodiments. Although permuted generator polynomials can be calculated "on-the-fly" in software as will be shown, this is not generally preferred because it may not substantially reduce the number of calculations required to calculate, check, or trap errors in a syndrome. The preferred embodiment for software is to pre-calculate the permuted generators and store them in a look up table. The number of entries in the look up table is $2^m$. For example, a two bit shift implementation would have four look-up table entries, a three bit shift implementation would have eight entries, and so on.

To create a look-up table, the permuted generators are calculated from all of the possible combinations of "quotient bit patterns" for the selected shift distance. The generators are then sorted into a table using their most significant bits as the table indices. The number of msb's used is equal to the shift distance. The number of bits stored per entry is equal to the syndrome length g, which is the same as the original generator polynomial length minus one. The remaining permuted generator bits are implicitly known, as they are the index into the table.

Figure 3:
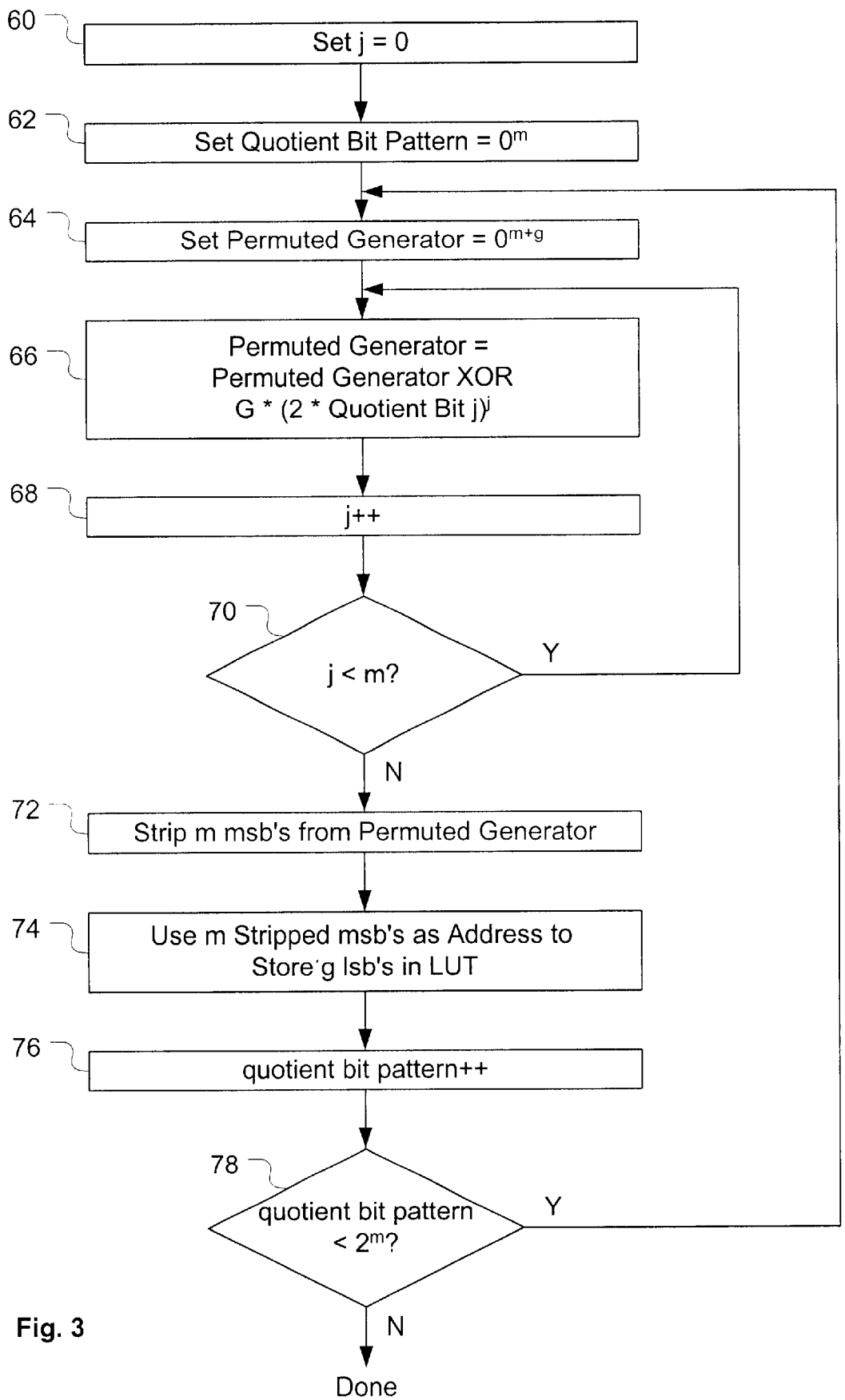
FIG. 3 contains a flowchart for filling a permuted generator polynomial LUT, useful with embodiments of the invention.

FIG. 3 illustrates, in flow chart form, one method for creating a permuted generator polynomial look-up table for use in the present invention. At block 60, a counter j is initialized, and at block 62, a quotient bit pattern is initialized to $0^m$ (where $0^x$ represents an x-bit-wide zero value). At block 64, a permuted generator is initialized to $0^{m+g}$. At block 66, the permuted generator is XORed with a new term. This term represents the original generator polynomial G multiplied by $2^j$ when quotient bit j=1. When quotient bit j=0, this term is zero. At block 68, j is incremented. Decision block 70 compares j to m, and if j is smaller, control is transferred back to block 66 to continue calculation of the current permuted generator. When j=m, a permuted generator has been completely calculated, and control is passed to block 72.

Block 72 strips the m msb's from the permuted generator and uses them to form an address. At block 74, the remaining g lsb's of the permuted generator are then stored in a look-up table, at an address corresponding to the m msb's. Finally, the quotient bit pattern is incremented at block 76, and decision block 78 checks to see if the table has been completely filled. If not, control is returned to block 64 for calculation of the next permuted generator.

The method shown in FIG. 3 may be run once each time the syndrome calculator is loaded or powered on. Alternately, this method may be used once or infrequently to create semi-permanent or permanent permuted generator lookup table data, which is then stored on magnetic disk, optical disk, RAM, NVRAM, ROM, or the like. Such data may be stored compressed or uncompressed, remotely or locally, and/or transferred from one storage location to another at runtime for more efficient use. A cyclic code error detection apparatus that must handle two or more different BCH codes could store permuted generator polynomials for each BCH code in a separate table, allowing fast switching between modes by switching tables.

As an example of the method shown in FIG. 3, using the BCH(15,7) code discussed previously and selecting a shift distance of four, sixteen generator permutations are calculated. The detailed calculation of the permuted generators for the first four quotient bit patterns is given below, the remaining generators are similarly determined.

| 0000 | 0001 |
|---|---|
| 000000000 | 111010001 |
| 0000000000 | 0000000000 |
| 00000000000 | 00000000000 |
| 000000000000 | 000000000000 |
| 000000000000 | 000111010001 |

| 0010 | 0011 |
|---|---|
| 000000000 | 111010001 |
| 1110100010 | 1110100010 |
| 00000000000 | 00000000000 |
| 000000000000 | 000000000000 |
| 001110100010 | 001001110011 |

Table 1 lists for each four-bit table index (which was obtained from the permuted generator's four msb's), the corresponding permuted generator (less its four msb's), and the quotient bit pattern used to calculate the permuted generator.

TABLE 1

| Table Index | Permuted Generator | Quotient Bit Pattern |
|---|---|---|
| 0000 | 00000000 | 0000 |
| 0001 | 11010001 | 0001 |
| 0010 | 01110011 | 0011 |
| 0011 | 10100010 | 0010 |
| 0100 | 11100110 | 0110 |
| 0101 | 00110111 | 0111 |
| 0110 | 10010101 | 0101 |
| 0111 | 01000100 | 0100 |
| 1000 | 00011101 | 1101 |
| 1001 | 11001100 | 1100 |
| 1010 | 01101110 | 1110 |
| 1011 | 10111111 | 1111 |
| 1100 | 11111011 | 1011 |
| 1101 | 00101010 | 1010 |
| 1110 | 10001000 | 1000 |
| 1111 | 01011001 | 1001 |

Figure 4:
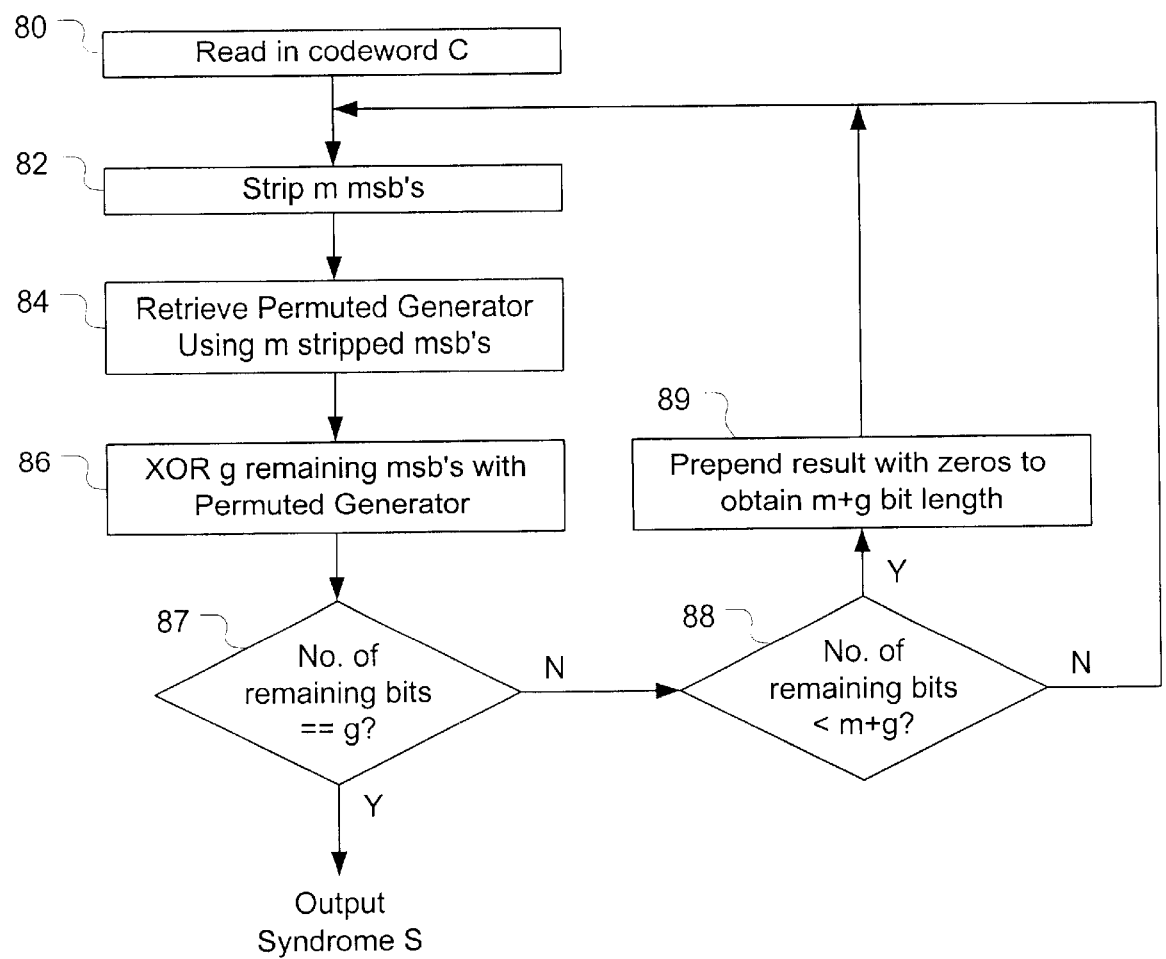
FIG. 4 contains a flowchart for calculating a syndrome according to an embodiment of the invention.

The permuted generators can now be used to calculate initial and iterative syndromes. FIG. 4 shows a method for calculating a syndrome. The input codeword C used to calculate a syndrome can be many things. It can be a string of information bits (possibly shifted by g, the syndrome length), a codeword with embedded information bits, a codeword with separate information bit and CRC fields, or another syndrome, appropriately shifted.

FIG. 4 is a method for calculating a syndrome by division of codeword C, but where the equivalent result of m prior art shift-and-divide operations can be obtained in a single step. The codeword C is supplied to block 82 of FIG. 4, where m msb's are stripped from C to form an address. At block 84, a permuted generator is retrieved from the permuted generator polynomial unit (either a look-up table or alternate implementation) using the m-msb address. Block 86 XOR's the g remaining msb's of C with the retrieved permuted generator. Decision block 87 then checks whether further iterations are required on the result of block 86. If further iterations are required, the result of block 86 is further checked by block 88 to verify that the result is at least m+g bits long. If the result is sufficiently long, it is supplied as the new "codeword" to block 82 for another iteration, otherwise, the result is prepended with zeros by block 89 and then supplied to block 82 for another iteration. When decision block 87 transfers control out of the loop, the result is the desired syndrome S.

To further illustrate this method, the transmit codeword CRC for the BCH(15,7) example described in the background is calculated using the permuted generators of Table 1. The msb's of the first current dividend (that dividend being the information bits times $x^8$) are 1001, and thus address the permuted generator 11001100 from Table 1. Performing modulo 2 subtraction (i.e., XORing) results in the second current dividend 01101100000 when the ending zeros of the original dividend are dropped down. The process of permuted generator selection and XOR continues until the syndrome is derived. Note that the calculated CRC is indeed the same CRC that was calculated with the prior art method.

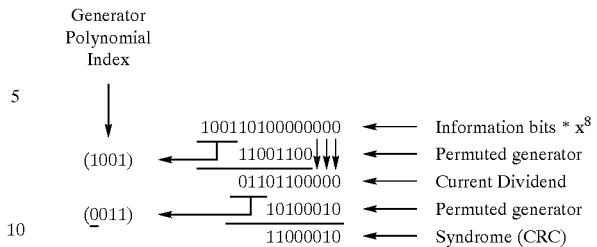

The CRC is attached to the information bits using prior art methods.

Note that in the second iteration, a zero was prepended to the current dividend to form a dividend of 12 bits. Prepending the zero makes the length of the dividend equal to the length of the syndrome plus the length of the step size, thus allowing the creation of a valid index into the permuted generator table. Alternately, the zero could have been prepended in the initial iteration, as shown below.

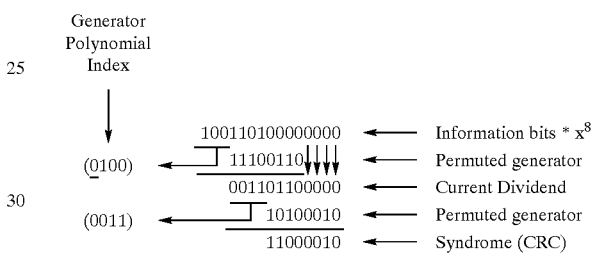

Assuming the same error pattern as was used before for the BCH(15,7) example, the receive codeword would again be 100000011000010.

| | |
|---|---|
| 100110111000010 | Transmit codeword |
| 000110100000000 | Error pattern |
| 100000011000010 | Receive codeword |

To correct the received codeword, the method described above is used to calculate an initial syndrome S for the received codeword:

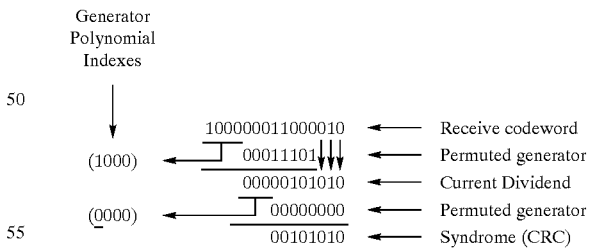

To perform burst error trapping, the syndrome is next iteratively shifted by the shift distance m and divided by the appropriate permuted generator polynomial. The shift distance m must be selected such that it is less than or equal to the syndrome width minus the largest correctable burst error width. Otherwise, a burst error may be shifted entirely through the syndrome in one iteration, and would not be trapped and detected.

The error is located when the greatest distance between ones contained in the syndrome, inclusive of the positions of the ones, is less than the largest correctable burst error distance t. Stated another way, when the number of leading and trailing zeros in the current syndrome is greater than or equal to g−t, the error has been trapped.

The test for a trapped error in syndrome S is optimized to the syndrome width g, the maximum correctable burst error width t, the selected shift distance m, and the native word width of the given system. First, a first group of bits, typically the g−(m+t)+1 most significant bits, are tested for an all-zero pattern. If these bits are not all zero, then the error has not been trapped. The all-zero msb pattern can be tested by bit-wise ANDing S with a g bits-wide bit mask that contains ones in the g−(m+t)+1 msb's and zeros elsewhere. The mask can be adapted to the native word width of the system, such that only system mask words that contain ones are actually ANDed. System mask words which contain only zeros do not require ANDing, as the result in known to be zero. Second, a second group of bits, typically the m−1 least significant bits of S, are fed into an $2^{m-1}$-entry look-up table (LUT) as an address. The output of the LUT is an (m−1)-bit wide mask which is bit-wise ANDed with a third group of bits, typically bits t to m+t−2 of S. This ANDing can also be optimized to the system word width by padding the mask with zeros and operating on system word boundaries. If the result of this ANDing operation is also zero, then the error has been trapped.

As an example, an allowable set of bit groups for the BCH(15,7) code, which has a maximum correctable burst width of four, and using a shift distance of four, would be: group one contains 8−(4+4)+1=1 bit (bit 7); group two contains 4−1=3 bits contiguous (bits 0 to 2); and group three contains the other 4−1=3 bits contiguous to group one (bits 4 6).

Error trapping can actually be performed using various bit groupings. In general, the first group of bits can be any contiguous set of g−(m+t)+1 bits of the syndrome that contains at least one end bit of the syndrome (msb or lsb) and may contain both end bits; the second group of bits can be any contiguous set of m−1 bits adjacent to the first group of bits; and the third group of bits are the other set of m−1 contiguous bits adjacent to the first group of bits. Further, the bits at each end of the syndrome are considered adjacent and contiguous to each other.

The error trapping LUT contains $2^{m-1}$ entries. Each entry is a mask which tests the third group of bits of S based upon the second group of bits of S. The masks test that at most t contiguous, non-zero bits are contained in the syndrome. The LUT entries are generated based upon the least significant bit of the LUT address which contains a one. If p is the position of the least significant address bit which contains a one, then bits 0 to m−p−2 of the mask are one and bits m−p−1 to m−2 are zero. For example, if address bit 0 contains a one, then all mask bits are one. If address bit 0 is zero and address bit 1 is one, then mask bits 0 to m−3 are one and only mask bit m−2 is zero. The remaining masks are similarly generated.

The maximum number of shift/divide operations required is equal to the ceiling of the codeword length minus one divided by the shift distance.

$$\text{max\_operations} = \left\lceil \frac{\text{codeword\_length} - 1}{\text{shift\_distance}} \right\rceil$$

For the BCH(15,7) example below, the burst error is located when the distance between ones in the syndrome is four or less (8−4=4). Note that the error is located after only two operations, rather than the seven required by the prior art.

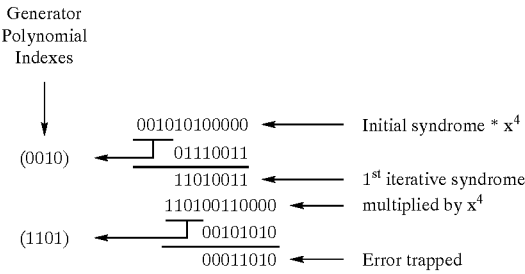

The error pattern is the entire syndrome. The error location is determined by the number of iterative divisions required to trap the error. The error location is equal to the codeword length minus the iteration number times the shift distance modded with the codeword length.

error_location=(codeword_length−(iteration_number*shift distance))mod codeword_length For the BCH(15,7) example, this is equal to bit 7.

7=(15−(2*4))mod 15

The receive codeword is corrected by multiplying the error pattern by x raised to the error location and adding it to the receive codeword.

| 100000011000010 | Receive codeword |
| 000110100000000 | Error pattern * $x^{\text{error location}}$ |
| 100110111000010 | Corrected codeword |

The corrected information is then extracted from the corrected codeword.

In all, the method disclosed herein required only four shift/divide operations, while prior art required fourteen. Furthermore, the shift distance could have been selected to be eight for a longer syndrome, which would allow an eight bit microprocessor to perform the error correction without any bit shifting.

Figure 5:
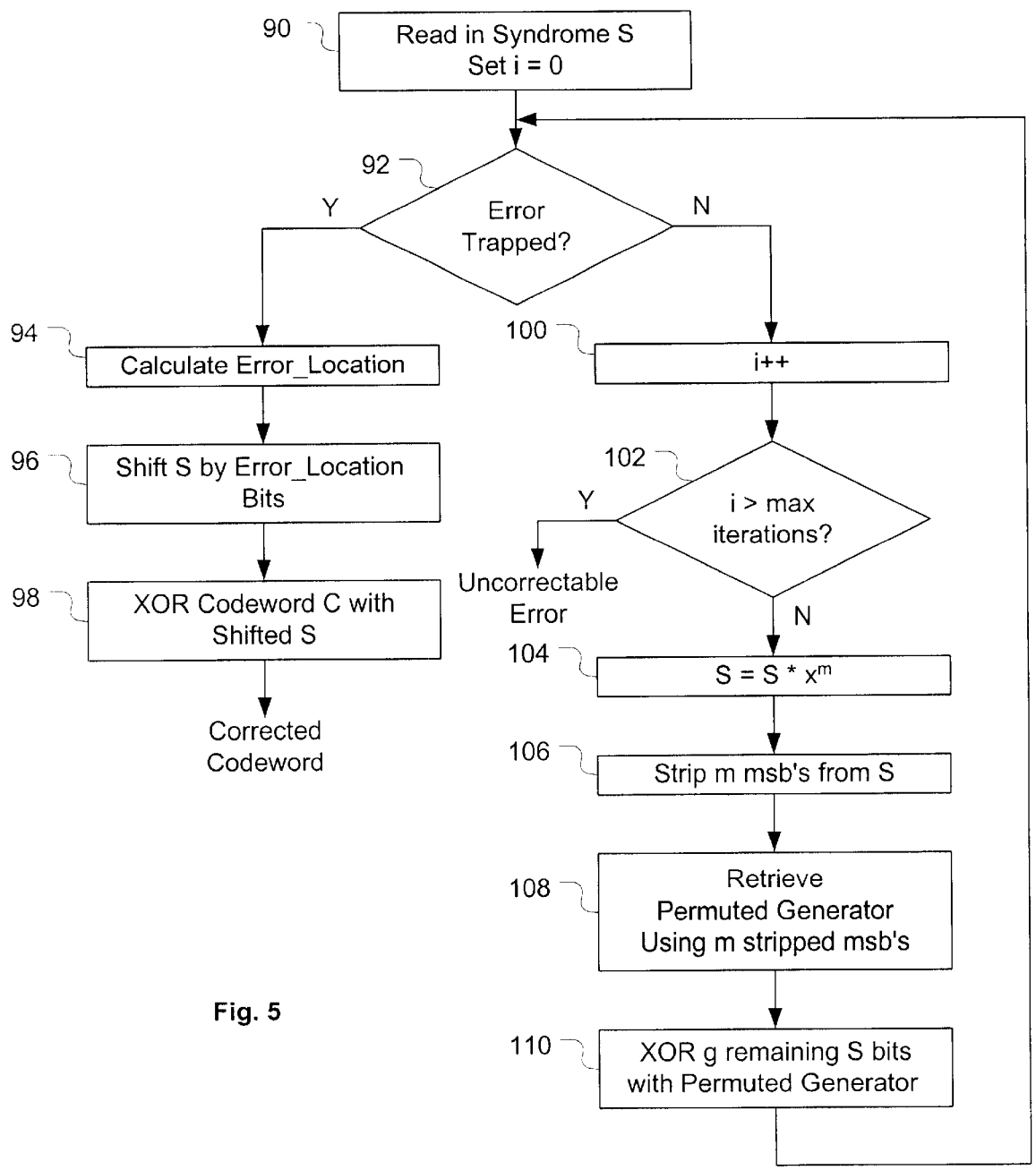
FIG. 5 contains a flowchart for error correction according to an embodiment of the invention.

FIG. 5 illustrates an error trapping and correcting function according to an embodiment of the invention. A syndrome S is input, and a counter i is initialized at block 90. S is checked at decision block 92 for whether it indicates a trapped error has already been found. If not, an iterative syndrome ie is calculated at blocks 100 through 110 and checked for a trapped error. If an error is trapped, the codeword is corrected at blocks 94–98.

If the tested syndrome has not trapped the error, block 100 first iterates i. Block 102 then tests i against a maximum number of iterations. If max iterations has been surpassed, this indicates that the error was never trapped in a full cycle through the syndromes, and therefore an uncorrectable error exists. If max iterations has not been surpassed, the next iterative syndrome is calculated at blocks 104–110.

Block 104 multiplies S by $x^m$, in essence appending m zeros to S. If m is equal to a byte, word, etc., literal execution of block 104 can be avoided—instead, the method can merely realign the operands to simulate the shifting operation.

Next, block 106 strips m msb's from S to form an address. Using this address, block 108 retrieves a permuted generator from a permuted generator polynomial LUT or other implementation. Block 110 XORs the g remaining bits of S with this permuted generator to form a new iterative syndrome S that is m syndromes distant from the last iterative syndrome.

When an error it trapped, block 94 calculates the error location as described above. At block 96, the relative positioning of the syndrome and the codeword are shifted by the error location. Finally, block 98 XORs the relatively-shifted syndrome and codeword to produce a corrected codeword.

Figure 6:
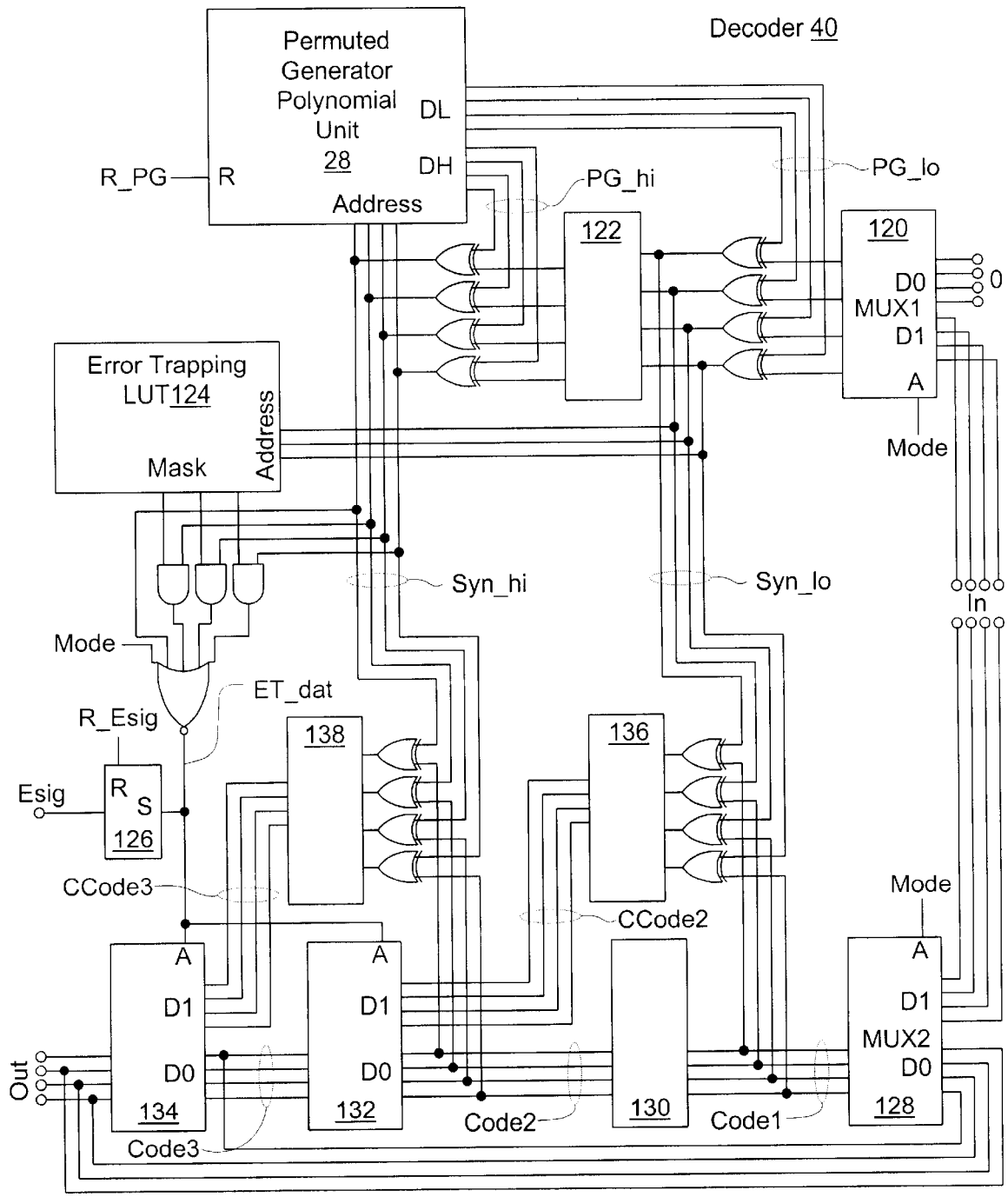
FIG. 6 shows a hardware embodiment for a BCH(15,7) error-correcting decoder according to an embodiment of the invention.

FIG. 6 shows a hardware implementation for a decoder 40, according to an embodiment of the invention, for performing error detection and correction on BCH(15,7) codewords. This circuit may be integrated on a chip by itself or with other circuitry, integrated on several chips, or implemented as discrete logic.

Decoder 40 uses a shift distance m=4. Input to decoder 40 is at the four bit lines In, output is taken at the four bit lines Out and a result signal Esig. Thus a fifteen-bit codeword is read into or out of decoder 40 at a rate of four bits per clock cycle, and requires four clock cycles to input or output an entire codeword. This is merely one method of inputting and outputting signals to the circuit, selected to aid understanding of the invention. In alternate embodiments, codewords could be read in and out fully in parallel, fully serially, or in some other fashion, as is well understood by those skilled in the art.

The syndrome calculator of decoder 40 comprises multiplexing register 120, register 122, and their associated XOR gates. An internally-generated Mode signal connects to address A of multiplexing register 120, such that when A is high, four bits will be read from In on the next clock, and when A is low, four low bits will be read on the next clock. The selected four bits become available on the four output lines of register 120 after being clocked in. Register 122 operates similarly, but has only one set of inputs. Design of registers 120 and 122 is well within the ordinary skill in the art, and can be accomplished, e.g., using flip-flops and standard logic gates.

Each of the four respective output lines of register 120 and of register 122 is tied to one input of a corresponding one of eight two-input XOR gates. The four lsb's of the permuted generator polynomial output by unit 28, PG_lo, are connected to the other inputs of the first four XOR gates. Similarly, the four msb's of the permuted generator polynomial, PG_hi, are connected to the other inputs of the second four XOR gates. Output from the syndrome calculator is taken at the output of the eight XOR gates, on lines Syn_hi and Syn_lo. Syn_lo is also connected to the inputs of register 122.

The output bits Syn_hi are fed to the address port of permuted generator polynomial unit 28. Although other forms of operation are possible, in this embodiment the address is clocked in on one clock cycle, and the corresponding permuted generator polynomial DL and DH is valid on the next clock cycle. Unit 28 also has a reset R connected to an internal control signal R_PG. When R_PG is asserted, unit 28 outputs zeros no matter what input is supplied on Syn_hi. This allows the feedback path from unit 28 to be disabled while a codeword is shifted into position for syndrome calculation.

The error trapper of decoder 40 consists of error trapping LUT 124, a combination of three AND gates and one five-input NOR gate, and SR flip-flop 126. Error trapping LUT 124 has a three-bit address connected to the three lsb's of Syn_lo, which addresses the LUT with the m−1 lsb's of the syndrome. The msb of the upper four bits of the syndrome, Syn_hi, which corresponds to bits g−(m+t)+1, is input to the NOR gate to check for a zero value. The next three msb's of Syn_hi, which correspond to bits t to t+m−2, are tested against the mask output by the LUT via the AND and NOR gates.

When the syndrome is consistent with a trapped error, the NOR gate asserts ET_dat for one clock cycle. The NOR gate also has an input connected to internal control signal Mode- when Mode is asserted, ET_dat will remain deasserted no matter what value is supplied on Syn_hi and Syn_lo. LUT 124 can be implemented with discrete logic, ROM, programmable memory, or some combination of these technologies. Note also that LUT 124 could accept all syndrome bits and the Mode signal itself to produce ET_dat without the AND and NOR gates, if one were willing to expand LUT 124 to include an ET_dat output corresponding to every possible syndrome.

SR flip-flop 126 is set when ET_dat is asserted, and is reset when an internal control signal R_Esig is asserted. The output of flip-flop 126 is Esig, which indicates that a burst error was trapped (or none existed) in the current codeword.

The error corrector of decoder 40 consists of four-bit registers 136 and 138 and the eight XOR gates tied to the inputs of registers 136 and 138. The outputs CCode2 and CCode3 of registers 136 and 138 are connected into a circular shift register consisting of registers 128, 130, 132, and 134.

The circular shift register is loaded from the input signal In. When Mode is asserted, In is loaded into multiplexing register 128. When Mode is deasserted, multiplexing register 128 is loaded with circular input consisting of the three low-order bits of Out and the high-order bit of Code3. Register 128 supplies its four-bit output, Code1, to the inputs of register 130. Register 130 supplies its four-bit output, Code2, to the inputs D0 of multiplexing register 132. Finally, register 132 supplies its four-bit output, Code3, to the inputs D0 of multiplexing register 134. Note that the D1 inputs of multiplexing registers 132 and 134 are connected, respectively, to receive corrected codes CCode2 and CCode3 from registers 136 and 138. Input to registers 132 and 134 is taken from the D1 inputs when ET_dat is asserted, allowing the corrected code to be inserted into the codeword as it shifts through the circular shift register.

Corrected code CCode2 is formed by XORing Code1 with Syn_lo. Corrected code CCode3 is formed by XORing Code2 with Syn_hi. Registers 136 and 138 delay these results one clock cycle, allowing LUT 124 time to detect a trapped error in the same Syn_lo and Syn_hi values. When a trapped error is detected, the corrected code is available simultaneously at CCode2 and CCode3 for insertion into the circular shift register.

Figure 7:
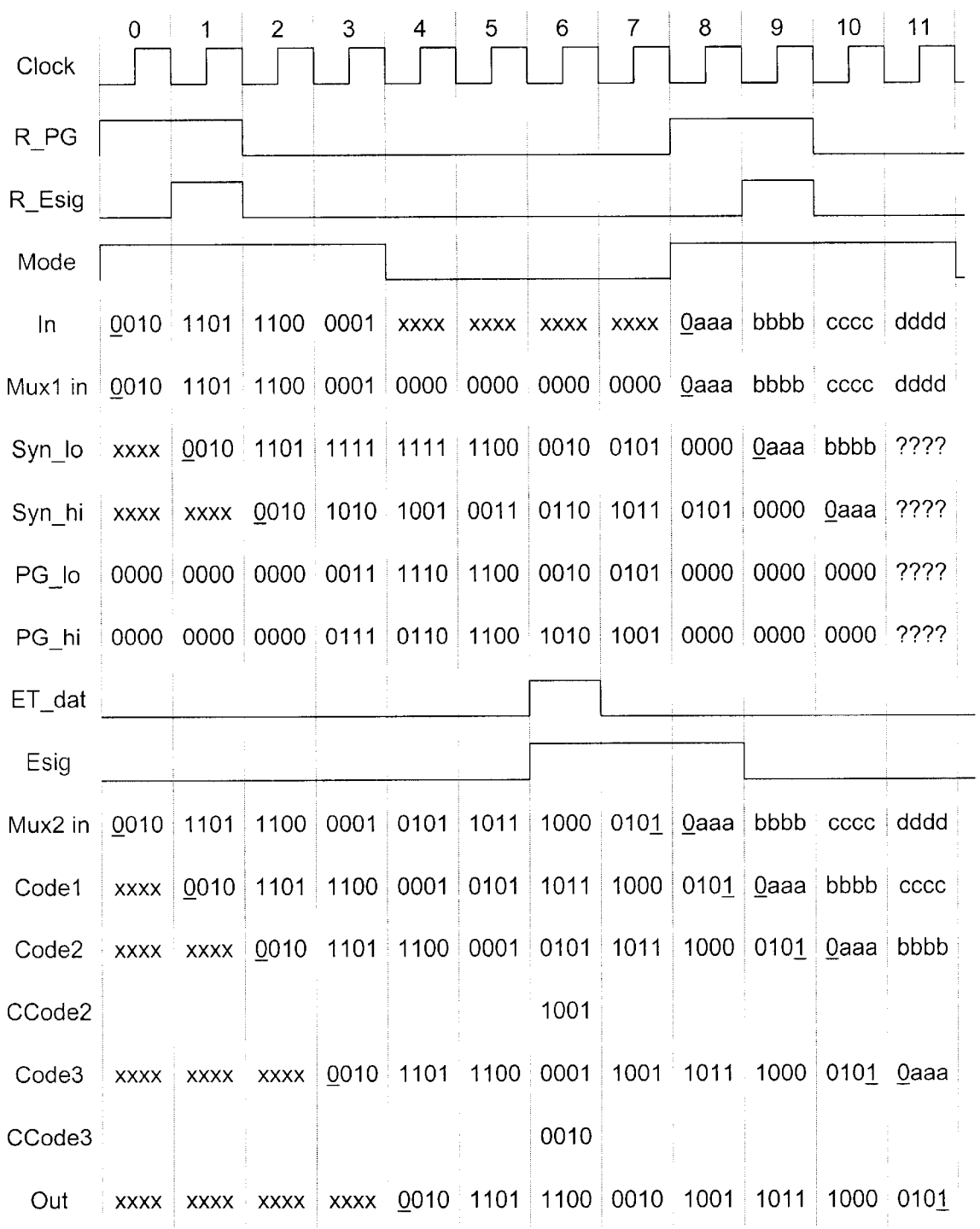
FIG. 7 illustrates a timing diagram for the decoder embodiment of FIG. 6.

FIG. 7 shows a timing diagram for an error-correcting operation using decoder 40 of FIG. 6. The complete operation for an input codeword occupies twelve clock cycles. Four of these clock cycles are overlapped with processing of the next input codeword, however, such that decoder 40 outputs a corrected 15-bit codeword every eight clock cycles.

An input codeword 0010 1101 1100 0001 is supplied at In during clocks 0–3. This codeword represents a true codeword 100 1101 1100 0010, distorted by a burst error pattern 110 0000 0000 0011, and prepended with a leading 0 to form four four-bit input segments. A second input codeword 0aaa bbbb cccc dddd is supplied at In during clocks 8–11. At clocks 4–7, the value at In does not matter, as Mux1 and Mux2 are each taking their inputs from elsewhere.

During clocks 4–7, Mode is deasserted. This causes zeros to be shifted into Mux1, and Mux2 to take its circular input. Mode deassertion also allows LUT 124 to perform error trapping on the initial and iterative syndromes. The initial syndrome is calculated during clocks 3 and 4, and iterative syndromes are calculated during each of clocks 5, 6, and 7. Thus, the syndrome appearing at each of clocks 4, 5, 6, and 7 is examined for trapped errors.

At clock 5, the syndrome at Syn_hi, Syn_lo is 0011 1100, representing a trapped error. Note that the number of leading and trailing zeros in the syndrome at clock 5 is four, indicating that the distance between 1's in the syndrome is also four. Thus, at clock 6, ET_dat goes high to indicate a trapped error and set Esig.

At clock 5, the syndrome 0011 1100 is also XORed with the bits 0001 0101, representing, respectively, the last four bits of the input codeword, which are at Code2, and the first four bits of the input codeword, which are at Code1. This corrects the burst error that appeared in the first two and last two bits of the original codeword, and makes the corrected code bits 0010 1001 available at the outputs of registers 138 and 136 during clock 6, when ET_dat is high. During clock 6, registers 134 and 132 will thus accept the corrected code and insert it into the correct position in the codeword.

The corrected output codeword 1001 1011 1000 0101(the trailing 1 is a repetition of the high-order bit) is output during clock cycles 8–11, as the next codeword is being shifted into the circular register.

Figure 8:
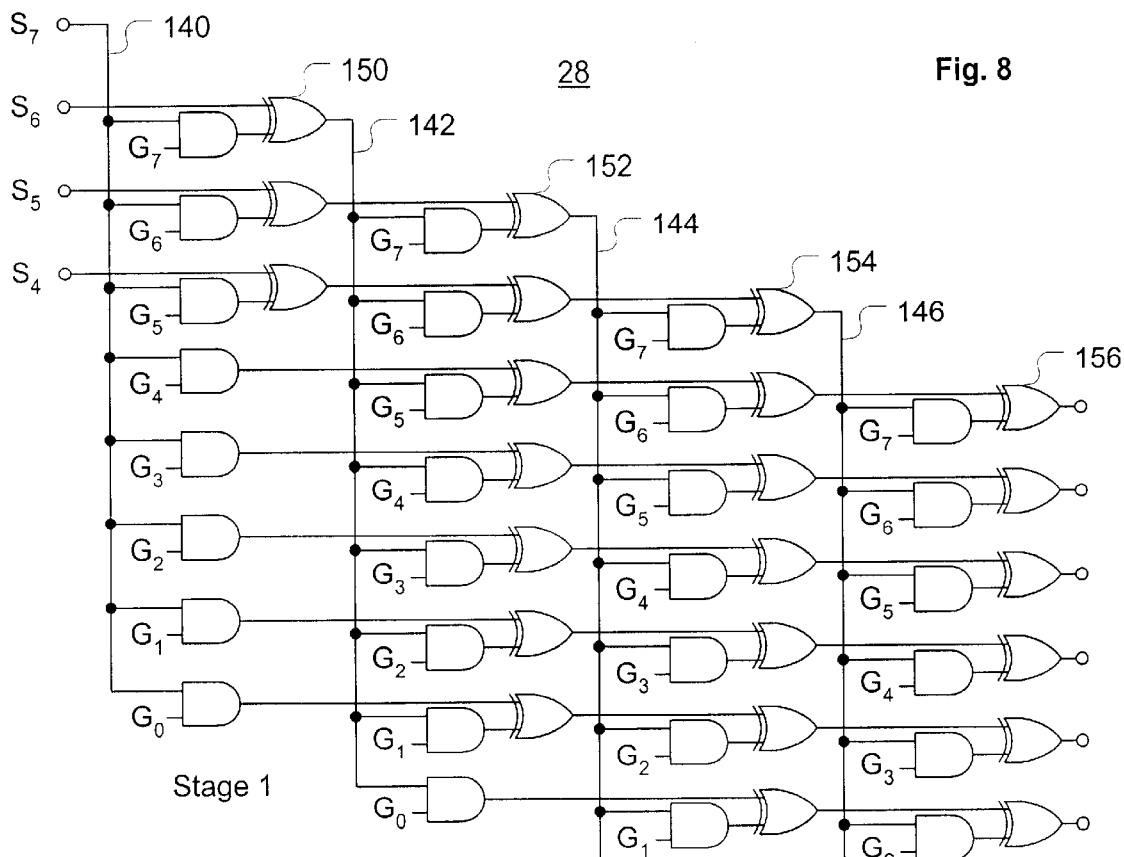
FIG. 8 shows a hardware implementation for a permuted generator polynomial unit according to one embodiment of the invention.

Permuted generator polynomial unit 28 may be implemented with a LUT, like the software implementation, but other implementations are possible. FIG. 8 shows a hardware implementation that calculates a permuted generator polynomial for the four-bit shift length BCH(15,7) example "on the fly" using four cascaded stages of XOR gates. Bits $S_7$ through $S_4$ are the input "address", which in FIG. 6 would be the four msb's of the syndrome, Syn_hi, unless R_PG were asserted (then bits $S_7$ through $S_4$ would be 0000). Bits $G_7$ through $G_0$ are the coefficients of the generator polynomial, $G_8x^8+G_7x^7+G_6x^6+G_5x^5+G_4x^4+G_3x^3+G_2x^2+G_1x^1+G_0$. For the BCH(15,7) code (111010001), $G_8=1$, $G_7=1$, $G_6=1$, $G_5=0$, $G_4=1$, $G_3=0$, $G_2=0$, $G_1=0$, and $G_0=1$.

Each stage is "enabled" or "disabled" with one of stage enable lines 140, 142, 144, 146. When a stage is "disabled", each bit line tied to its stage enable line is deasserted. When a stage is "enabled", each of these bit lines is asserted. When the enable/disable bit lines are ANDed with generator polynomial signals $G_7$–$G_0$, the result represents one of two values: when enabled, the result represents the bits of the generator polynomial; when disabled, the result is all zeros. Thus a stage can be used for one generator polynomial division by modulo subtraction operation, if the stage enable line can be made to appropriately indicate whether the stage should be enabled or disabled. By "shifting" the connections between a stage by one bit relative to its previous stage, the circuit can be used to perform multiple generator polynomial division steps.

Conceptually, unit 28 operates to "cancel" each of bits $S_7$–$S_4$, forming in the process the permuted generator that cancels the input bits. Thus, $S_7$ drives stage enable line 140. Since the generator polynomial will always have a 1-bit at $G_8$, if bit $S_7$ is 1, the generator polynomial will be XORed with bits $S_7$–$S_4$ (and, conceptually, five trailing zeros) to "cancel" bit $S_7$. Note that neither an $S_7$ result, nor a result for the five trailing zeros, requires an explicit XOR calculation, since one operand is known a priori for each of these calculations.

Likewise, Stage 2 must "cancel" bit $S_6$, if it was not canceled by the operation of Stage 1. Thus stage enable line 142 is driven by the output of XOR gate 150, which represents conditional XORing of bit $S_6$ with $G_7$. And Stage 3 must "cancel" bit $S_5$, if it was not canceled by Stages 1 and 2. Thus stage enable line 144 is driven by the output of XOR gate 152, which represents conditional XORing of bit $S_5$ with $G_7$ and $G_6$. Similar logic applies to stage enable line 146, bit $S_4$, and XOR gate 154.

The permuted generator appears at the eight outputs of Stage 4, with the msb at the output of XOR gate 156 and the lsb at the output of XOR gate 158.

Figure 9:
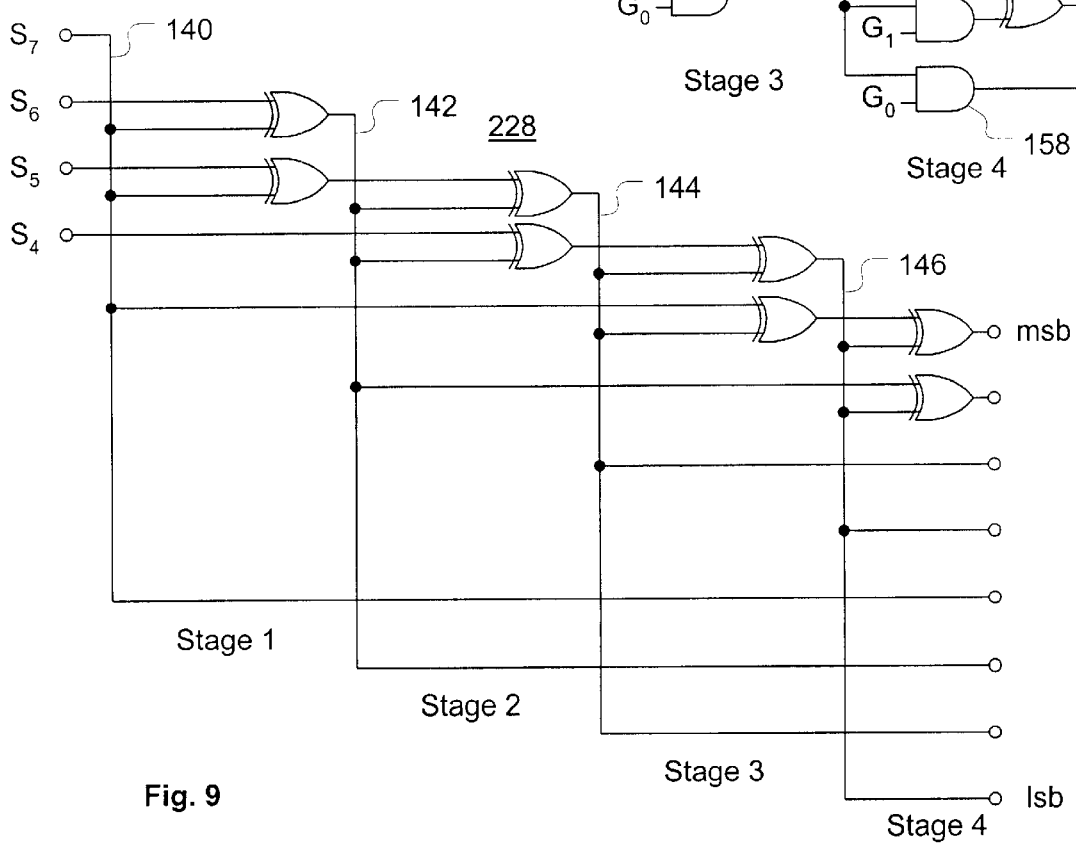
FIG. 9 shows the hardware implementation of FIG. 8 after simplification for a known generator polynomial.

It should be noted that significant simplification can be made to unit 28 when the unit is designed for use with a fixed generator polynomial G. For instance, an AND gate having an input $G_i$ in each stage can be replaced with an open connection where $G_i=0$. And the AND gates in each stage can be replaced with a short circuit connection to the stage enable line where $G_i=1$. Where a bit is to be XORed with an open connection, that bit can simply be passed through to the next stage. Where both bits are open connections, the XOR gate can be replaced with an open connection. Thus for the BCH(15,7) generator polynomial 111010001, FIG. 9 shows a simplified circuit 228 with equivalent functionality to circuit 28 of FIG. 8.

Each of circuits 28 and 228 have advantages. Circuit 228 requires only eight XOR gates to implement. On the other hand, circuit 28 can be configured to work with different generator polynomials and different step sizes. For instance, if an eight-bit generator polynomial, $G'=G'_7x^7+G'_6x^6+G'_5x^5+G'_4x^4+G'_3x^3+G'_2x^2+G'_1x^1+G'_0$, were input, the G' polynomial coefficients, starting at $G'_6$ and proceeding to $G'_0$, would be respectively assigned to the circuit's $G_7$ to $G_1$ inputs, the circuit's $G'_0$ input would be set to 0, and the circuit's lsb output would be ignored, with the correct permuted generator appearing at the output's seven msb's. Or, a shift width of three could be calculated with circuit 28 by applying only syndrome bits $S_7$–$S_5$, setting input $S_4$ to zero, and taking the output at stage 3 (this is equivalent to setting bit $S_4$ to zero and taking the output normally, but avoids the delay of the fourth stage).

A software equivalent of FIG. 8 is also possible. Although this requires multiple operations, the operations can be byte-aligned such that no shifts are required. For example, the following subroutine calculates a four-stage value PERMUTED_GEN for an input BIT_1 to 4 and the BCH(15,7) generator polynomial:

```
const BitShift = 0 × 100;

const Generator = 0 × 1d1;  /* i.e., binary 111010001 */
const GenShift1 = Generator * 2;
const GenShift2 = Generator * 4;
```

-continued

```
const GenShift3 = Generator * 8;
short PermutedGen(short BIT_1to4)
{ short PermGen = 0;

BIT_1to4 *= BitShift;

if (BIT_1to4 && 0×800) PermGen = BIT_1to4 ^ GenShift3;
    if (PermGen   && 0×400) PermGen = PermGen  ^ GenShift2;
    if (PermGen   && 0×200) PermGen = PermGen  ^ GenShift1;
    if (PermGen   && 0×100) PermGen = PermGen  ^ Generator;

return (PermGen);

}
```

This routine may, of course, be generalized with a loop, with some loss of efficiency.

The preceding embodiments have been described with reference to a BCH(15,7)code and a shift distance of four. From the principles taught by these embodiments, those of ordinary skill can design other embodiments for other cyclic codes, other code and/or generator lengths, and other shift distances. One of ordinary skill in the art will recognize that the concepts taught herein can be further tailored to a particular application. For instance, calculation of an address for a LUT, and the organization of the LUT, may require that the address be based upon, but not exactly, the msb's of the dividend. Such minor modifications are encompassed within the invention, and are intended to fall within the scope of the claims.

What is claimed is:

1. A method for calculating a syndrome, using a generator polynomial G of length g+1, for a cyclic error correction codeword C of length n containing a k-bit information field, the method comprising:
   preselecting a shift distance In, where k≧m>1;
   prependinig C with a sufficient number of zeros to create an m+g bit codeword, and stripping the m most significant bits from this codeword to form a length-m address A1;
   retrieving a first permuted generator polynomial, corresponding to address A1, from a permuted generator polynomial unit; and
   XORing the first permuted generator polynomial with the g most-significant remaining bits of C, forming a result R.

2. The method of claim 1, further comprising:
   stripping the in most-significant bits from R to form an address A2;
   retrieving a second permuted generator polynomial, corresponding to address A2, from the permuted generator polynomial unit; and
   XORing the second permuted generator polynomial with the g most-significant remaining bits of R.

3. The method of claim 2, further comprising iterating the stripping, retrieving, and XORing steps, recited in claim 2, on R until, at the XORing step of the last iteration, the g most-significant remaining bits of R comprises all remaining bits of R, thereby computing the syndrome.

4. The method of claim 1, wherein C is $S*x^m$, where S is a syndrome for a codeword, and R is an iterative syndrome for the codeword.

5. The method of claim 4, where S is also an iterative syndrome for the codeword.

6. The method of claim 4, further comprising constraining the shift distance m to the range g−t≧m>1, where t is the largest correctable burst error width for the codeword, and performing error trapping on the iterative syndrome.

7. The method of claim 6, wherein performing error trapping comprises examining the iterative syndrome for the presence of leading zeros and trailing zeros, such that when the number of leading and trailing zeros Z≧g−t, the error has been trapped.

8. The method of claim 6, wherein performing error trapping comprises measuring the distance D between the first 1 and the last 1 in the iterative syndrome, inclusive of the endpoints, such that when D≦t, the error has been trapped.

9. The method of claim 6, wherein performing error trapping comprises selecting and processing three sets of preselected bits taken from the iterative syndrome, the processing comprising:
   testing a first set of zero or more preselected bits for an all-zero pattern;
   using the second set of preselected bits to address an error mask lookup table and obtain a corresponding error mask;
   logically ANDing the third set of preselected bits with the error mask and testing the result for an all-zero pattern; and
   generating an error trapping signal from the two all-zero pattern tests, where the error trapping signal indicates whether the three sets of preselected bits are consistent or inconsistent with a trapped error.

10. The method of claim 9, where end bits of the iterative syndrome are considered contiguous, and the first group of preselected bits comprise any contiguous set of g−(m+t)+1 bits of the syndrome that contain at least one end bit of the syndrome, the second group of preselected bits comprise any group of m−1 contiguous bits adjacent to the first group of bits, and the third group of preselected bits comprise the other group of m−1 contiguous bits adjacent to the first group of bits.

11. The method of claim 9, where the first group of preselected bits comprise the g−(m+t)+1 most significant bits of the syndrome, the second group of preselected bits comprise the m−1 least significant bits of the syndrome, and the third group of preselected bits comprise bits t to m+t−2 of the syndrome.

12. The method of claim 6, further comprising, when an error is trapped for an iterative syndrome, correcting the error using the iterative syndrome.

13. The method of claim 12, wherein correcting the error using the iterative syndrome comprises:
   aligning the iterative syndrome with the original codeword by shifting either the original codeword or the iterative syndrome by a distance E, where E=(n−(j*n)) mod n, j represents the number of iterations on an original syndrome that were required to generate the iterative syndrome, and n is the length of the original codeword; and
   XORing the aligned iterative syndrome and original codeword together to form a corrected codeword.

14. The method of claim 1, wherein the permuted generator polynomial unit comprises a permuted generator polynomial look-up table, the method further comprising:
   pre-calculating a length g+m permuted generator polynomial for each possible permutation P of m bits; and storing the g least-significant bits of each permuted generator polynomial in a look-up table, at an address associated with the m most-significant bits of that permuted generator polynomial.

15. The method of claim 14, wherein pre-calculating a length g+m permuted generator polynomial comprises forming a polynomial that represents the XOR result of in terms $G_i$, $0 \leq i < m$ where, when bit i of P is a 0, $G_i=0$, and when bit i of P is a 1, $G_i=G*x^i$.

16. Cyclic code error detection apparatus comprising:

a permuted generator polynomial unit that accepts an input address and outputs, for a defined generator polynomial, a g-bit permuted generator polynomial corresponding to a shift distance m and the input address; and a syndrome calculator to calculate a g-bit syndrome for a codeword using a permuted generator polynomial obtained from the permuted generator polynomial unit, for an input address comprising the m most significant bits from the codeword, after prepending the codeword with sufficient zero bits to create a codeword at least m+g bits long.

17. The error detection apparatus of claim 16, configured to encode information bits into a codeword.

18. The error detection apparatus of claim 16, configured to decode information bits from a codeword.

19. The error detection apparatus of claim 16, wherein the syndrome calculator calculates iterative g-bit syndromes for a codeword.

20. The error detection apparatus of claim 16, comprising a programmable microprocessor configured as the syndrome calculator.

21. The error detection apparatus of claim 16, wherein the permuted generator polynomial unit comprises a look-tip table to store the g-bit permuted generator polynomials.

22. The error detection apparatus of claim 16, wherein the permuted generator polynomial unit comprises an m-stage cascaded XOR circuit to calculate an g-bit permuted generator polynomial for an m-bit address, each stage generating a bit pattern corresponding to bits from the defined generator polynomial when enabled and generating an off bit pattern when disabled, the first stage XORing selected bits from its generated bit pattern with the m-bit address to form a stage output bit pattern, each of the remaining stages XORing selected bits from its generated bit pattern with shifted bits from the preceding stage's output bit pattern to form a stage output bit pattern.

23. The error detection apparatus of claim 22, wherein each of the m stages of the XOR circuit comprises a stage enable line connected to a plurality of bit enable lines, each bit enable line representing the location of a "1" bit of the defined generator polynomial.

24. The error detection apparatus of claim 23, wherein for stages other than the first stage, the stage enable line is connected to the most significant bit of the preceding stage's output bit pattern.

25. The error detection apparatus of claim 16, wherein the syndrome calculator also calculates iterative syndromes given an initial syndrome, using a permuted generator polynomial from the permuted generator polynomial unit to perform each iteration.

26. The error detection apparatus of claim 16, wherein the permuted generator polynomial unit has ml address lines and g data lines, the syndrome calculator comprising:

an m-bit wide register having m inputs and m corresponding outputs;

m first two-input XOR gates, each gate having an output coupled to a corresponding address line of the permuted generator polynomial unit, each gate having one input tied to a corresponding data line of the permuted generator polynomial unit and the other input tied to a corresponding register output; and m second two-input XOR gates, each second gate having an output coupled to a corresponding input of the register, each second gate having one input tied to a corresponding data line of the permuted generator polynomial unit and the other input connected to receive corresponding shifted data from a prior stage of the syndrome calculator.

27. The error detection apparatus of claim 26, the syndrome calculator further comprising an m-bit wide input stage, with an output selectable between m codeword bits and in zeros.

28. The error detection apparatus of claim 16, further comprising:

an error trapper to detect the presence of correctable errors in the codeword by examining the syndrome produced by the syndrome calculator; and an error corrector to correct the codeword using the syndrome produced by the syndrome calculator, when the error trapper detects the presence of a correctable error in the codeword.

29. The error detection apparatus of claim 28, wherein the error trapper comprises:

an all zero detector that tests a first set of g−(m+t)+1 contiguous bits for an all zero pattern, where the bits are selected from the output of the syndrome calculator and contain at least one end bit of the syndrome, and where t is the largest correctable burst error width for the codeword;

an error trapping look up table addressable using a second set of m−1 contiguous bits selected from the output of the syndrome calculator and adjacent to the first set of bits; and an error trapping mask comparator that receives input from the output of the error trapping look up table and from a third set of m−1 contiguous bits selected from the output of the syndrome calculator and adjacent to the first set of bits and.

30. The error detection apparatus of claim 28, wherein the first set of bits are the g−(m+t)+1 most significant bits of the syndrome, the second set of bits are the m−1 least significant bits of the syndrome, and the third set of bits are bits t to t+m−2 of the syndrome.

31. The error detection apparatus of claim 28, wherein the error corrector comprises a plurality of m-bit wide data stages, the number of m-bit wide data stages being large enough that the entire codeword can be held in the data stages of the error corrector, the data stages chained to form a circular shift register connected such that the m most significant bits of the codeword can be re-supplied to the first data stage after the most significant bit reaches the last data stage.

\* \* \* \* \*

UNITED STATES PATENT AND TRADEMARK OFFICE
CERTIFICATE OF CORRECTION

PATENT NO. : 6,640,327 B1  
APPLICATION NO. : 09/704390  
DATED : October 28, 2003  
INVENTOR(S) : Hallberg It is certified that error appears in the above-identified patent and that said Letters Patent is Cover Sheet, Item (56) References Cited, U.S. PATENT DOCUMENTS should read

| --Document Number | Issue Date | Name |
| --- | --- | --- |
| 3,162,837 | 12/22/64 | Meggitt |
| 3,465,287 | 09/02/69 | Kennedy et al. |
| 3,622,985 | 11/23/71 | Ayling et al. |
| 3,745,525 | 07/10/73 | Hong et al. |
| 3,745,526 | 07/10/73 | Hong et al. |
| 3,859,630 | 01/07/75 | Bennett |
| 4,151,510 | 04/24/79 | Howell et al. |
| 4,677,623 | 06/30/87 | Iwasaki et al. |
| 5,631,909 | 05/20/97 | Weng et al. |
| 5,721,744 | 02/24/98 | Hallberg--. |

Cover Sheet, Item (56) References Cited, OTHER DOCUMENTS should read

--Griffiths, Georgia and Stones, G. Carlyle; *The Tea-Leaf Reader Algorithm: An Efficient Implementation of CRC-16 and CRC-32*; Communications of the ACM; Vol. 30, No. 7; July 1987; pp. 617-620.

Perez Aram; *Byte-wise CRC Calculations*; IEEE MICRO; June 1983; pp. 40-50.

11/19/1999 printouts from http://web.syr.edu; *Cyclic Codes*; pp. 1-5; *Linear Codes*; pp. 1-7; and *Weight and Distance*; pp. 1-2.--

UNITED STATES PATENT AND TRADEMARK OFFICE
CERTIFICATE OF CORRECTION

PATENT NO. : 6,640,327 B1
APPLICATION NO. : 09/704390
DATED : October 28, 2003
INVENTOR(S) : Hallberg It is certified that error appears in the above-identified patent and that said Letters Patent is hereby corrected as shown below:

Column 11, line 31, "contiguous (bits 0 to 2);" should read --contiguous to group one (bits 0 to 2);--.

Column 11, line 33, "(bits 4 6)." should read --(bits 4 to 6).--.

Column 12, line 49, "syndrome ie is" should read --syndrome is--.

Column 16, line 44, "circuit's $G'_0$ input" should read --circuit's $G_0$ input--.

Column 17, line 40, "distance In, where" should read --distance m, where--.

Column 17, line 53, "the in most-significant" should read --the m most-significant--.

Column 19, line 7, "result of in terms" should read --result of m terms--.

Column 19, line 34, "a look-tip table" should read --a look-up table--.

Column 19, line 64, "has ml address" should read --has m address--.

Column 20, line 20, "and in zeros." should read --and m zeros.--.

Signed and Sealed this

Twenty-fifth Day of March, 2008

JON W. DUDAS
*Director of the United States Patent and Trademark Office*